(12) United States Patent
Hanna et al.

(10) Patent No.: US 12,538,797 B2
(45) Date of Patent: Jan. 27, 2026

(54) SUBSTRATE FOR IMPROVED HEAT DISSIPATION AND METHOD

(71) Applicant: Intel Corporation, Santa Clara, CA (US)

(72) Inventors: Carlton Hanna, San Jose, CA (US); Wolfgang Molzer, Ottobrunn (DE); Stefan Reif, Munich (DE); Georg Seidemann, Landshut (DE); Stephan Stoeckl, Schwandorf (DE); Pouya Talebbeydokhti, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 17/703,400

(22) Filed: Mar. 24, 2022

(65) Prior Publication Data

US 2023/0307313 A1 Sep. 28, 2023

(51) Int. Cl.
*H01L 23/373* (2006.01)
*H01L 23/367* (2006.01)

(52) U.S. Cl.
CPC ........ *H01L 23/3732* (2013.01); *H01L 23/367* (2013.01)

(58) Field of Classification Search
CPC .......................... H01L 23/3732; H01L 23/367
See application file for complete search history.

(56) References Cited

U.S. PATENT DOCUMENTS

| | | | | |
|---|---|---|---|---|
| 6,388,207 B1* | 5/2002 | Figueroa | ............... | H05K 1/115 |
| | | | | 257/E23.079 |
| 7,224,039 B1* | 5/2007 | McGuire | ........... | H01L 21/02118 |
| | | | | 257/532 |
| 8,309,210 B1* | 11/2012 | Keen | .................... | H05K 1/0373 |
| | | | | 428/209 |
| 9,049,805 B2* | 6/2015 | Findley | ............... | H05K 3/4626 |
| 9,986,636 B2* | 5/2018 | Mahler | ................. | H05K 3/007 |
| 2005/0045855 A1* | 3/2005 | Tonapi | .................... | H01L 24/29 |
| | | | | 252/500 |
| 2008/0144291 A1* | 6/2008 | Hu | ......................... | H05K 1/053 |
| | | | | 361/720 |
| 2010/0237476 A1* | 9/2010 | Sakurai | ............... | H01L 21/3146 |
| | | | | 257/632 |
| 2010/0259910 A1* | 10/2010 | Hayashi | .................. | B32B 15/14 |
| | | | | 361/783 |
| 2012/0097431 A1* | 4/2012 | Vasoya | .................... | B32B 5/26 |
| | | | | 174/257 |
| 2012/0248627 A1* | 10/2012 | Gaul | .................. | H01L 23/3677 |
| | | | | 257/774 |
| 2021/0057305 A1* | 2/2021 | Yaita | ........................ | H10D 8/60 |
| 2021/0147739 A1* | 5/2021 | Sugimoto | ............... | C08K 3/28 |
| 2022/0002463 A1* | 1/2022 | De | ........................ | C08L 51/003 |

* cited by examiner

*Primary Examiner* — Eugene Lee
(74) *Attorney, Agent, or Firm* — Akona IP PC

(57) ABSTRACT

A semiconductor package comprises a package substrate comprised of at least a first layer of dielectric material including a portion of diamond dust material. The diamond dust material is comprised of diamond dust particles. The semiconductor package includes at least one electrical connection coupled through layers of the package substrate.

16 Claims, 4 Drawing Sheets

SUBSTRATE FOR IMPROVED HEAT DISSIPATION AND METHOD

TECHNICAL FIELD

Embodiments pertain to packaging of integrated circuits (ICs). Some embodiments relate to a package substrate having dielectric material at least partially comprised of diamond dust.

BACKGROUND

Electronic systems often include integrated circuits (ICs) that are interconnected and packaged as a subassembly and include printed circuit boards (PCBs). A PCB can include a single layer construction or a multi-layer construction. For single layer circuit boards, a dielectric layer can be laminated with layers of a conductive material on opposing sides of the dielectric layer. Multi-layer circuit boards can include additional dielectric layers and conductive layers. For instance, multi-layer circuit boards can include alternating dielectric layers and conductive layers. The dielectric layer/s comprise a substance that is a poor conductor of electricity and is/are used as an insulating layer in the PCB build up to isolate vertical and lateral connections that can be used in the electronic system. However, many dielectric materials have poor thermal conductivity making it difficult to dissipate heat from hotspots such as power management units, central processing units (CPUs) and other components. Thus, there are general needs for devices, systems and methods that address thermal conductivity in electronic circuits.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Flip chip is a method for interconnecting dies such as semiconductor dies or other semiconductor devices, IC chips, integrated passive devices and microelectromechanical systems (MEMS), to external circuitry with solder bumps that have been deposited onto the chip pads. The solder bumps are deposited on the chip pads on the top side of the wafer during the final wafer processing step. Flip chip packages, chiplets, and other electronic devices can include substrates and printed circuit boards (PCB). The substrates and PCB comprise layers of dielectrics to isolate vertical and lateral electrical connections.

However, many dielectric materials have poor thermal conductivity making it difficult to dissipate heat from hotspots such as power management units, central processing units (CPUs) and other components. Aspects of the disclosure address these and other concerns by incorporating diamond dust as a filler material in the dielectric materials used for substrates and PCB to enhance the thermal conductivity and heat dissipation of the dielectrics within the package setup. Diamond dust can be used within dielectric materials because diamond dust has no or low electrical conductivity, similar to other commonly-used dielectric materials. Dielectric materials can include mold materials, polymers, epoxies, or other thermoset matrix that embeds the diamond. In embodiments, in a mold material, the percentage of dust can affect follow characteristics of the mold, and accordingly percentage of diamond dust should be adjusted to avoid overly-thick mold material.

Figure 1:
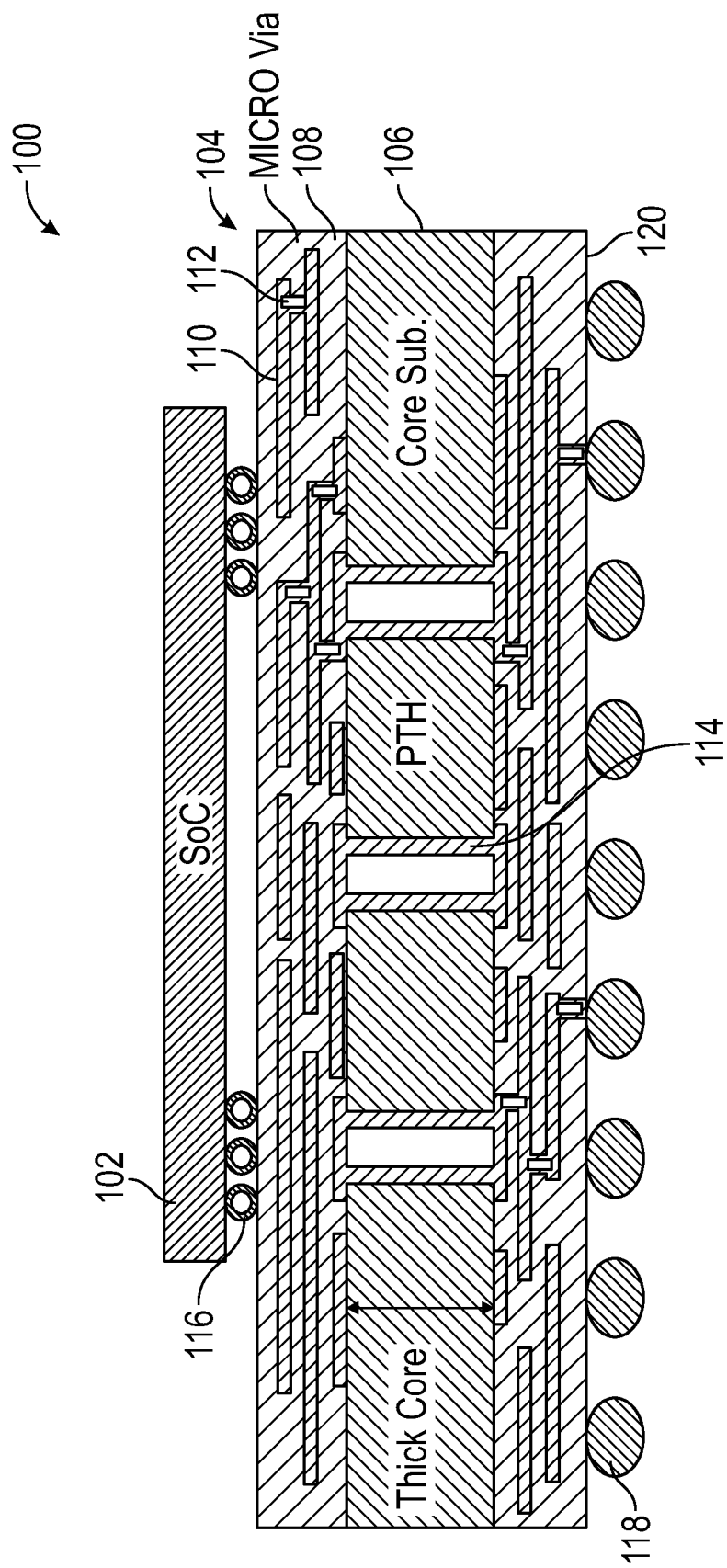
FIG. 1 is an illustration of an example of portions of an electronic device having a substrate that includes at least a portion of diamond dust in at least one dielectric layer in accordance with some embodiments.

FIG. 1 is an illustration of an example of portions of an electronic device 100 having a substrate 104 that includes at least a portion of diamond dust in at least one dielectric layer in accordance with some embodiments. The electronic device 100 includes a System on Chip (SoC) device 102 attached to a substrate 104. The substrate 104 can include a core layer 106. The core layer 106 can be comprised of a dielectric one layer core, comprised of fore example fiberglass or foam, with a first layer of metal on either surface. This first layer can serve as a "starting canvas" for the build up layers 108. While the device 100 is illustrated including a core layer 106, the device 100 can include structures without a core layer 106.

The substrate 104 can include at least one built up layer 108, which is also comprised of multiple layers of conductive material sandwiched between layers of dielectric material. The built up layer 108 can include electrically conductive traces 110 (e.g., metal traces) to route signals from the SoC device 102. The built up layer 108 can include multiple sublayers of traces 110, and the traces 110 can be formed in a dielectric material. Vias 112 are connected to the conductive traces 110. The vias 112 provide electrical continuity between conductive traces on different sublayers of the built up layer 108.

The core layer 106 can include includes through layer vias (TLVs) (e.g., through ceramic vias, or TCVs). In some examples, the TLVs include plated through holes (PTHs) 114. The PTHs may have having a sidewall plating that includes metal (e.g., one or more of titanium and copper).

The electronic device 100 shows one SoC device 102 attached to the top surface of the built up layer 108 for simplicity of the diagram, but there may be many ICs (e.g., chiplets) or multiple SoCs arranged on the top surface of the built up layer 108 and the substrate 104 may have a large X-Y dimension. The SoC device 102 includes bonding pads and solder bumps 116, and the top surface of the built up layer 108 also induces bonding pads (not shown in FIG. 1) to connect to the solder bumps 116. The conductive traces 110 of the built up layer 108 provide electrical continuity between the bonding pads of the SoC device 102 and the TLVs 114 of the core layer 106. Solder balls 118, can be, for example, ball grid arrays (BGA) made of conductive solder in an appropriate pattern to create electrical connections. Solder ball 118 can be on a second side 120 opposite the SoC device 102, for connecting device 100 to a circuit board or other component (not shown).

As mentioned earlier herein, dielectric material in available systems may have poor thermal conductivity making it difficult to dissipate heat. This can be of particular concern adjacent to power units or processing units, which can radiate large amounts of heat. In some available systems, heat sinks, heat pipes, and/or thermal interface material (TIM) are used to dissipate such heat. However, such solutions are typically only used on one side (e.g., on the side used to mount a device) and are expensive. Examples according to some aspects address these and other concerns by providing diamond dust as filler material in the dielectric materials. The diamond dust can be used in either or both of the core layer 106 and the built up layers 108. The diamond dust can enhance the thermal conductivity and heat dissipation of the dielectrics within the package and device 100 setup. In some examples, diamond dust can be used particularly in those substrates that have a high stack-up, e.g., more dielectric and conductive layers, relative to other substrates. Different percentages of diamond dust can be used within a given dielectric layer, based on the amount of heat that is anticipated to require dissipation, the amount of drilling that will be needed in a layer or a substrate, and other factors.

Diamond and therefore diamond dust have very good thermal conductivity. For example, where thermal conductivity is measured in Watts per meter per degree Kelvin, (W/mK), the thermal conductivity of diamond can be about 2000 W/mK. Due to the pyramidic grain structure of diamonds, diamond material can provide improved thermal conductivity properties. Furthermore, diamond dust material can be a cost effective material for providing thermal conductivity, due to widely available, low-cost byproducts of diamond machining. Diamond dust can be provided as diamond dust grains of sizes of less than 100 nanometers in diameter, or about 10 nanometers in diameter, or even smaller than 10 nanometers, so that diamond dust can be mixed into dielectric material in any proportion that provides for ease of drilling vias 112, through holes 114, etc. In some examples, the percentage of diamond dust material can be less than 80% by weight, or between 30-70% by weight, or about 30% by weight, although embodiments are not limited thereto.

The material can also be used to build big filler structures (or different shapes, layers, etc.), which can be implemented in one or more of the dielectric layer/s at the dielectric fabrication process.

Figure 2:
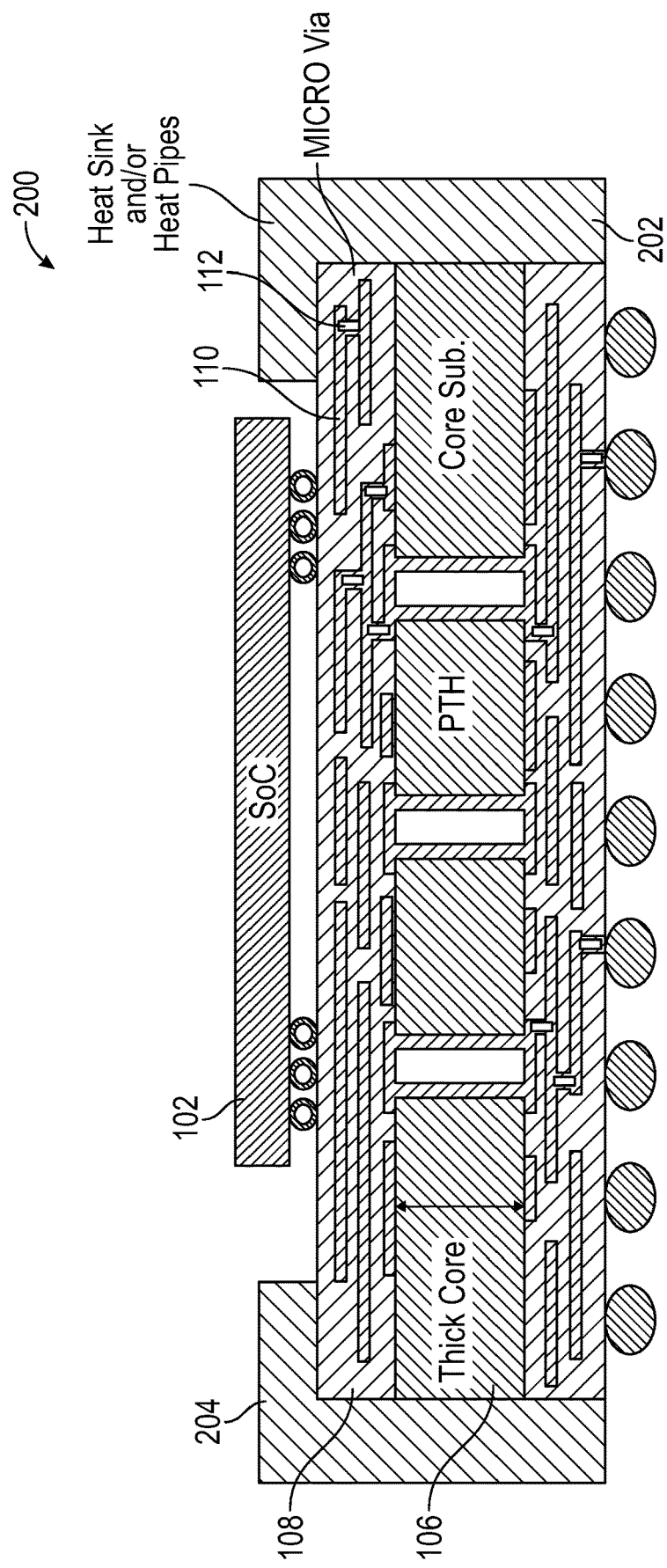
FIG. 2 is an illustration of an example of portions of an electronic device having a substrate that includes at least a portion of diamond dust in at least one dielectric layer and at least one heat pipe or heat sink in accordance with some embodiments.

FIG. 2 is an illustration of an example of portions of an electronic device 200 having a substrate that includes at least a portion of diamond dust in at least one dielectric layer and at least one heat pipe 202, 204 or heat sink in accordance with some embodiments. The device 200 includes similar structures as described above with respect to FIG. 1. In addition, heat pipes or heat sinks 202, 204, can be connected to substrates at either the built up layers 108 or core layer 106 for bottom cooling of hotspots. While heat pipes and heat sinks 202, 204 are shown at sides of the electronic device 200, heat sinks and heat pipes 202, 204 could additionally or alternatively be included at different locations such as over the SoC device 102, under the core layer 106, etc.

Figure 3:
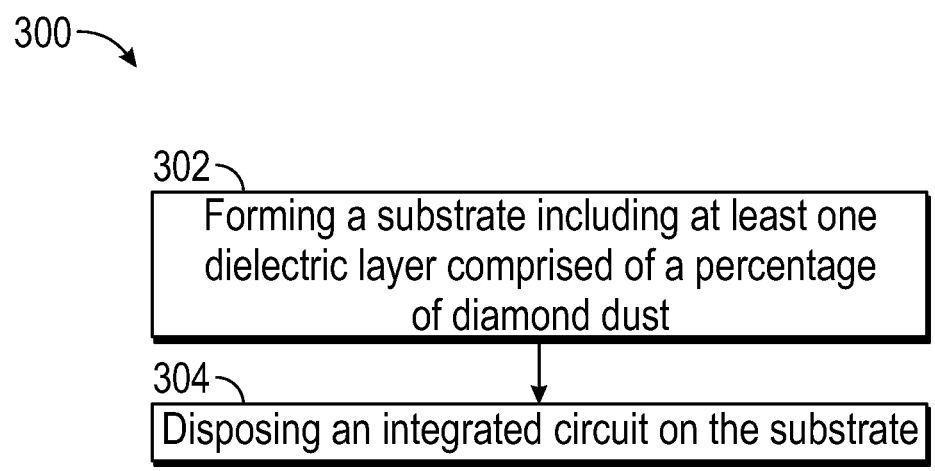
FIG. 3 illustrates a method of forming an electronic device in accordance with some embodiments.

FIG. 3 illustrate portions of an example of a method 300 of forming an electronic device 100 in accordance with some embodiments. The method 300 can begin with operation 302 with forming a substrate 104 including dielectric layers. At least a first layer of the dielectric layers can include a portion of diamond dust material. The diamond dust material can be comprised of diamond dust particles. In some embodiments, the diamond dust material can be distributed in an anisotropic distribution, or homogeneously. Different dielectric layers can include different percentages of diamond dust material, with percentages of diamond dust based on drilling needs of a dielectric layer, etc. The method 300 can include drilling (e.g., laser drilling or mechanical drilling) of structures including PTHs 114, vias 112, or providing traces 110 according to needs of the electronic device 100.

The method 300 can continue with operation 304 with disposing an integrated circuit (IC) (e.g., SoC device 102 on a surface of the substrate. The method can comprise connecting at least one heat sink 204 adjacent to and abutting the substrate 104 at a proximal side of the substrate 104.

The methods, devices, and systems described herein provide interconnect that can accommodate high frequency signals while providing very dense signal routing. An example of an electronic device using assemblies with system level packaging as described in the present disclosure is included to show an example of a higher level device application.

Figure 4:
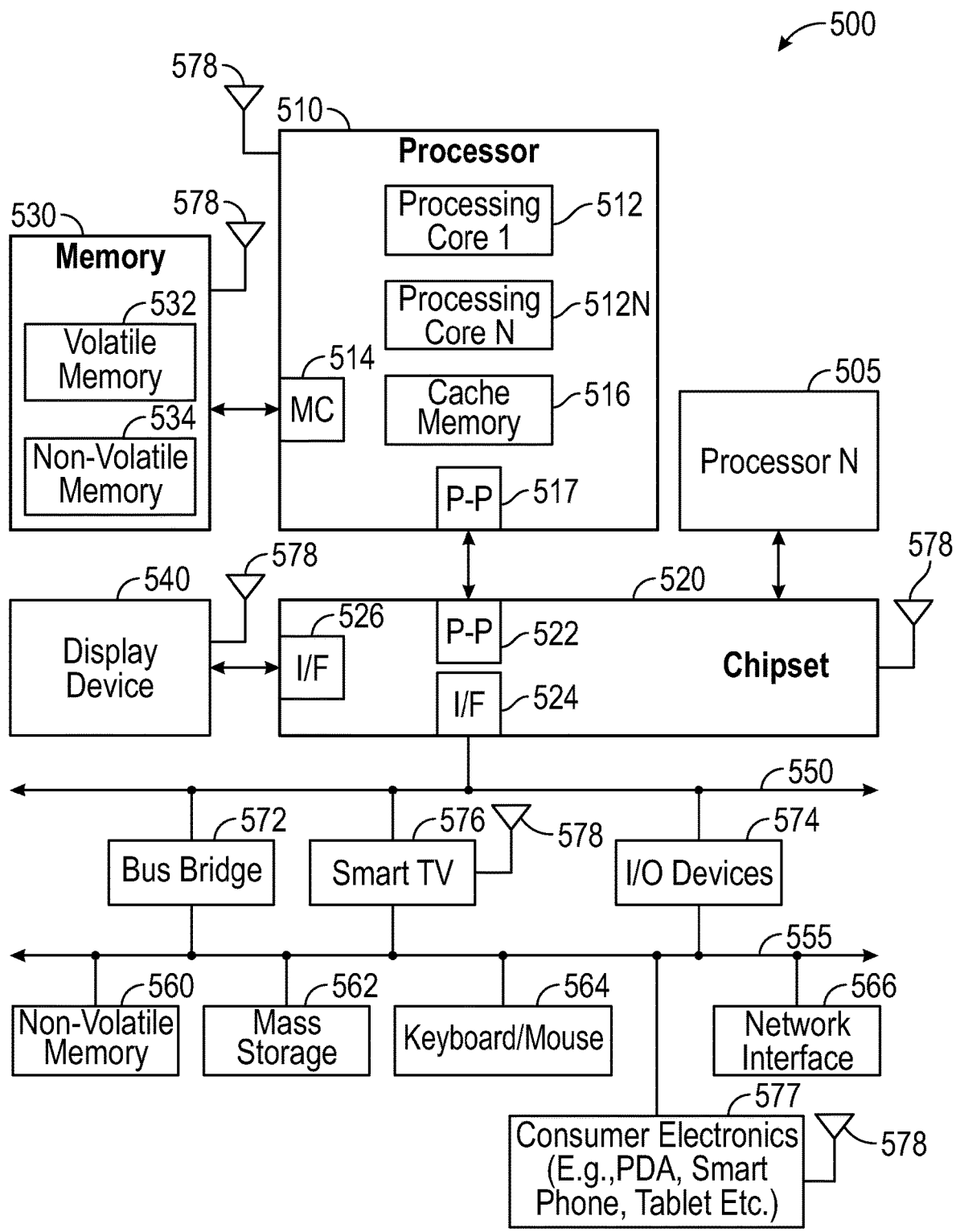
FIG. 4 illustrates a system level diagram in accordance with some embodiments.

FIG. 4 illustrates a system level diagram, according to one embodiment of the invention. For instance, FIG. 4 depicts an example of a system that can include an electronic device packaged with a substrate including at least one layer of dielectric material comprised of at least a portion of diamond dust material. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 500 is a system on a chip (SOC) system.

In one embodiment, processor 510 has one or more processing cores 512 and 512N, where N is a positive integer and 512N represents the Nth processor core inside processor 510. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505, display device 540, and other devices 572, 576, 574, 560, 562, 564, 566, 577, etc. Buses 550 and 555 may be interconnected together via a bus bridge 572. Chipset 520 connects to one or more buses 550 and 555 that interconnect various elements 574, 560, 562, 564, and 566. Chipset 520 may also be coupled to a wireless antenna 578 to communicate with any device configured to transmit and/or receive wireless signals. Chipset 520 connects to display device 540 via interface (I/F) 526. Display 540 may be, for example, a touchscreen, a liquid crystal display (LCD), a plasma display, cathode ray tube (CRT) display, or any other form of visual display device. In some embodiments of the invention, processor 510 and chipset 520 are merged into a single SOC. In one embodiment, chipset 520 couples with (e.g., via interface 524) a non-volatile memory 560, a mass storage medium 562, a keyboard/mouse 564, and a network interface 566 via I/F 524 and/or I/F 526, I/O devices 574, smart TV 576, consumer electronics 577 (e.g., PDA, Smart Phone, Tablet, etc.).

In one embodiment, mass storage medium 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 4 are depicted as separate blocks within the system 500, the functions performed by some of these blocks may be integrated within a single semiconductor circuit or die or may be implemented using two or more separate integrated circuits. For example, although cache memory 516 is depicted as a separate block within processor 510, cache memory 516 (or selected aspects of 516) can be incorporated into processor core 512.

The devices, systems, and methods described can provide improved thermal conductivity in electronic device packages. Examples described herein include one SoC for simplicity, but one skilled in the art would recognize upon reading this description that the examples can include more than one SoC system.

Additional Description and Examples

Example 1 includes a semiconductor package comprising a package substrate comprised of at least a first layer of dielectric material including a portion of diamond dust material, the diamond dust material comprised of diamond dust particles; and at least one electrical connection connected to a conductive layer of the package substrate.

In Example 2, the subject matter of Example 1 can optionally include wherein the diamond dust particles are less than about 100 nanometers in diameter.

In Example 3, the subject matter of any one of Examples 1-2 can optionally include wherein the diamond dust particles are about 10 nanometers in diameter.

In Example 4, the subject matter of any one of Examples 1-3 can include wherein the package substrate comprises at least a second layer of dielectric material, the second layer including a different percentage of diamond dust material than the first layer of dielectric material.

In Example 5, the subject matter of any one of Examples 1-4 can optionally include wherein the first layer of dielectric material includes a core of a cored substrate of the semiconductor package.

In Example 6, the subject matter of any one of Examples 1-5 can optionally include a second substrate layer that includes vias.

In Example 7, the subject matter of Example 4 can optionally include wherein at least one of the first layer and the second layer includes an anisotropic distribution of the diamond dust material.

In Example 8, the subject matter of Example 4 can optionally include at least one patterned through hole (PTH) in the package substrate.

Example 9 is an electronic device comprising a semiconductor die coupled to a package substrate, the package substrate including at least a first layer of dielectric material including a portion of diamond dust material, the diamond dust material comprised of diamond dust particles; and at least one electrical connection connected to a conductive layer of the package substrate.

In Example 10, the subject matter of Example 9 can optionally include wherein the semiconductor die includes a processor die.

In Example 11, the subject matter of any one of Examples 9-10 can optionally include wherein the semiconductor die includes a system-on-chip (SoC).

In Example 12, the subject matter of any one of Examples 9-11 can optionally include at least one heat sink structure adjacent to and abutting the package substrate.

In Example 13, the subject matter of any one of Examples 9-12 can optionally include wherein the diamond dust particles are less than about 100 nanometers in diameter.

In Example 14, the subject matter of any one of Examples 9-13 can optionally include wherein the diamond dust particles are about 10 nanometers in diameter.

In Example 15, the subject matter of any one of Examples 9-14 can optionally include wherein the package substrate includes at least a second layer of dielectric material, the second layer of dielectric material including a different percentage of diamond dust material than the first layer of dielectric material.

In Example 16, the subject matter of Example 15 can optionally include wherein the first layer includes a core of a cored substrate of the electronic device.

In Example 17, the subject matter of Example 15 can optionally include wherein the second layer of dielectric material is within one of a plurality of a layers that includes vias connected to electrical traces.

In Example 18, the subject matter of Example 15 can optionally include wherein at least one of the first layer and the second layer includes an anisotropic distribution of the diamond dust material.

In Example 19, the subject matter of Example 18 can optionally include wherein a side of at least one of the first layer and the second layer abuts a heat sink structure at a proximal side, and wherein a percentage of diamond dust at the proximal side is higher than a percentage of diamond dust further from the heat sink structure.

Example 20 is a method of forming an electronic device, the method comprising forming a substrate including dielectric layers, at least a first layer of the dielectric layers including a portion of diamond dust material, the diamond dust material comprised of diamond dust particles; and disposing an integrated circuit (IC) on a surface of the substrate.

In Example 21, the subject matter of Example 20 can optionally include connecting at least one heat sink adjacent to and abutting the substrate at a proximal side of the substrate.

In Example 22, the subject matter of any of Examples 20-21 can optionally include providing an anisotropic distribution of diamond dust in at least the first layer.

In Example 23, the subject matter of any of Examples 20-22 can optionally include wherein forming at least the first layer includes adding a percentage of diamond dust, wherein the percentage is less than or equal to 30% by weight.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A semiconductor package comprising:
    a package substrate comprised of:
        at least a first layer of dielectric material including a portion of diamond dust material, the diamond dust material comprised of diamond dust particles; and
        at least a second layer of dielectric material, the second layer including a different percentage of diamond dust material than the first layer of dielectric material, wherein at least one of the first layer and the second layer includes an anisotropic distribution of the diamond dust material, wherein a side of at least one of the first layer and the second layer abuts a heat sink structure at a proximal side, and wherein a percentage of diamond dust at the proximal side is higher than a percentage of diamond dust further from the heat sink structure; and
    at least one electrical connection connected to a conductive layer of the package substrate.

2. The semiconductor package of claim 1, wherein the diamond dust particles are less than about 100 nanometers in diameter.

3. The semiconductor package of claim 2, wherein the diamond dust particles are about 10 nanometers in diameter.

4. The semiconductor package of claim 1, wherein the first layer of dielectric material includes a core of a cored substrate of the semiconductor package.

5. The semiconductor package of claim 1, further comprising a second substrate layer that includes vias.

6. The semiconductor package of claim 1, further comprising at least one patterned through hole (PTH) in the package substrate.

7. An electronic device comprising:
    a semiconductor die coupled to a package substrate, the package substrate including:
        at least a first layer of dielectric material including a portion of diamond dust material, the diamond dust material comprised of diamond dust particles; and
        at least a second layer of dielectric material, the second layer including a different percentage of diamond dust material than the first layer of dielectric material, wherein at least one of the first layer and the second layer includes an anisotropic distribution of the diamond dust material, wherein a side of at least one of the first layer and the second layer abuts a heat sink structure at a proximal side, and wherein a percentage of diamond dust at the proximal side is higher than a percentage of diamond dust further from the heat sink structure; and
    at least one electrical connection connected to a conductive layer of the package substrate.

8. The electronic device of claim 7, wherein the semiconductor die includes a processor die.

9. The electronic device of claim 7, wherein the semiconductor die includes a system-on-chip (SoC).

10. The electronic device of claim 7, further comprising:
    at least one heat sink structure adjacent to and abutting the package substrate.

11. The electronic device of claim 7, wherein the diamond dust particles are less than about 100 nanometers in diameter.

12. The electronic device of claim 11, wherein the diamond dust particles are about 10 nanometers in diameter.

13. The electronic device of claim 7, wherein the first layer includes a core of a cored substrate of the electronic device.

14. The electronic device of claim 7, wherein the second layer of dielectric material is within one of a plurality of a layers that includes vias connected to electrical traces.

15. A method of forming an electronic device, the method comprising:
    forming a substrate including dielectric layers, at least a first layer of the dielectric layers including a portion of diamond dust material, the diamond dust material comprised of diamond dust particles and at least a second layer of dielectric layers including a different percentage of diamond dust material than the first layer;
    providing an anisotropic distribution of diamond dust in at least one of the first layer and the second layer;
    connecting at least one heat sink adjacent to and abutting the substrate at a proximal side of the substrate, wherein a side of at least one of the first layer and the second layer abuts a heat sink structure at a proximal side, and wherein a percentage of diamond dust at the proximal side is higher than a percentage of diamond dust further from the heat sink structure; and
    disposing an integrated circuit (IC) on a surface of the substrate.

16. The method of claim 15, wherein forming at least the first layer includes adding a percentage of diamond dust, wherein the percentage is less than or equal to 30% by weight.

* * * * *